United States Patent [19]

Rapp A. Karl

[11] Patent Number: 5,398,001
[45] Date of Patent: Mar. 14, 1995

[54] SELF-TIMING FOUR-PHASE CLOCK GENERATOR

[75] Inventor: Rapp A. Karl, Los Gatos, Calif.

[73] Assignee: National Semiconductor Corporation, Sunnyvale, Calif.

[21] Appl. No.: 70,614

[22] Filed: Jun. 2, 1993

[51] Int. Cl.⁶ .......................... H03K 3/04; H03K 5/13
[52] U.S. Cl. .................................... 327/258; 331/57; 327/295; 327/400
[58] Field of Search ................ 331/57; 307/269, 265, 307/601, 602, 606, 296.2; 328/62, 63

[56] References Cited

U.S. PATENT DOCUMENTS

| | | | |
|---|---|---|---|
| 4,554,465 | 11/1985 | Koike | 328/63 |
| 4,617,529 | 10/1986 | Suzuki | 331/57 |
| 4,794,275 | 12/1988 | Traa | 307/269 |
| 4,853,654 | 8/1989 | Sakurai | 331/57 |
| 4,910,471 | 3/1990 | Brahmbhatt et al. | 331/57 |
| 5,068,628 | 11/1991 | Ghoshal | 331/57 |
| 5,081,428 | 1/1992 | Atriss et al. | 331/57 |
| 5,130,566 | 7/1992 | Nguyen | 307/269 |
| 5,302,920 | 4/1994 | Bitting | 331/57 |

Primary Examiner—Timothy P. Callahan
Assistant Examiner—Toan Tran
Attorney, Agent, or Firm—Limbach & Limbach

[57] ABSTRACT

A four phase clock generator, which can be employed to operate a charge pump, is configured using coupling elements that ensure that the four phases are non-overlapping. Two of the phases are created with delay buffers that have substantial delays that mainly determine the clock frequency. The delay buffers and coupling elements produce delays that are made variable in response to a control current. This provides a clock whose frequency is proportional to a control current.

7 Claims, 4 Drawing Sheets

SELF-TIMING FOUR-PHASE CLOCK GENERATOR

BACKGROUND OF THE INVENTION

The invention relates broadly to the charge pumps that are commonly employed in electrically erasable programmable read only memory (EEPROM) integrated circuit (IC) chips. The basic circuit operates at a relatively low voltage, such as 3 V or 5 V, but some of the circuit functions require a substantially higher voltage such as an internal 15 volts. This higher voltage is typically provided by means of an on chip charge pump form of voltage multiplier. The charge pump is made up of a plurality of stages driven from a plural phase clock. Typically, the clock is operated at a predetermined frequency and is operated continuously so that the highest available value of boosted voltage is present. Then, a voltage regulator is employed to drop the voltage to the desired level. Since the current required from the boosted voltage is typically low, a shunt regulator can be employed.

This form of on chip high voltage generation is wasteful of power because the excess voltage is reduced by a regulated current drain. The circuits are slow to start because a large number of clock cycles must be employed to produce the high voltage.

SUMMARY OF THE INVENTION

It is an object of the invention to produce a plural phase clock signal suitable for driving a charge pump.

It is a further object of the invention to produce a four phase clock signal adapted for operating a charge pump and having a frequency which can be varied by means of an input current.

It is a still further object of the invention to develop a four phase clock signal in which the clock transitions have prescribed relationships and which can be varied in frequency in response to an input current whereby the pump startup is produced at high current and, therefore, at high frequency which minimizes startup time.

These and other objects are obtained by developing a four phase clock in a circuit involving CMOS gates which are operated at controlled currents. As the currents in the gates are increased, the inherent stage delays are reduced. A pair of delay buffers also receive control currents which vary the delay intervals. Two of the clock phases involve the delay elements and all four clock phases involve voltage transitions that are employed to trigger the transitions of the other phases. The basic gate delays operate to avoid pulse overlap in the various clock phases. A simple logic circuit is employed to sense the states of four clock phases and to switch the gates to produce the desired clock signals. The result is a current responsive control that modulates the clock frequency. At zero current the clocks stop (the frequency is zero) and at maximum current the highest clock frequency is produced. Since achievement of the desired high voltage requires a large number of cycles, in the system employed the start up is operated at maximum current and therefore maximum frequency. This is effective in reducing start up time. In the event that no current drain is involved, once the charge pump output is achieved, the clocks can be shut off. When the voltage declines, the clocks are restarted and function to rapidly return the voltage to its desired value, thus regulating the voltage value. If a steady current drain is present the clock will be operated at a frequency that results in a steady value of voltage, thus regulating the voltage against the current drain. Any increase in the current drain results in raising the clock frequency to provide the additional charge.

DESCRIPTION OF THE INVENTION

Figure 1:
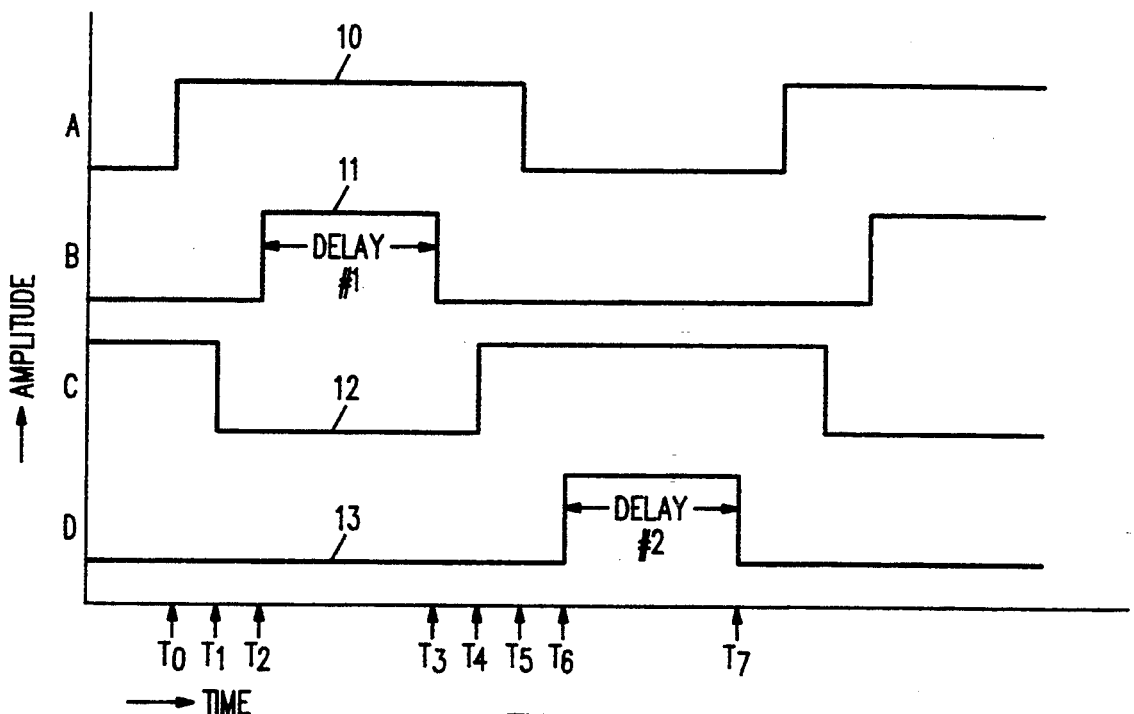
FIG. 1 is a graph showing the four desired clock phase signals.

FIG. 1 shows the timing relationships of the four phases of the desired clock signals. Waveforms 10 through 13, respectively, portray the clock waveforms A through D.

Figure 2:
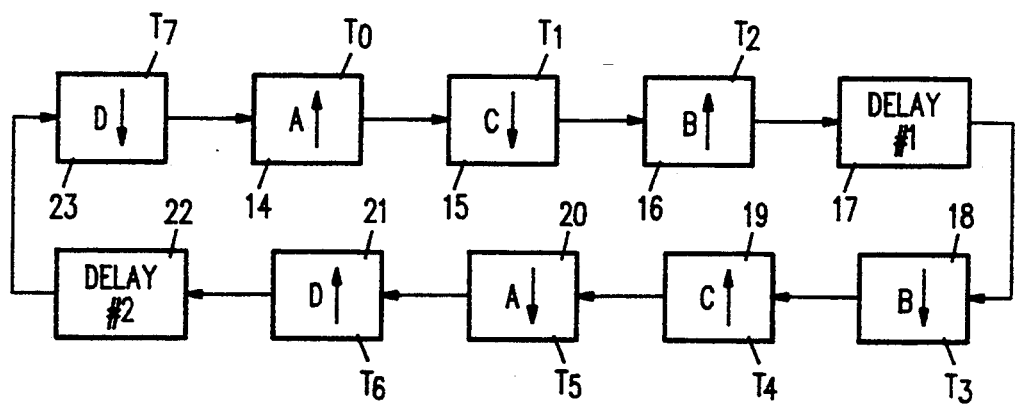
FIG. 2 is a block diagram showing the sequence of transitions in the waveforms of FIG. 1.

FIG. 2 is a block diagram showing the sequence of transitions in the clock signals. The rising transition at 14 occurs at $T_O$ and represents the first phase A transition shown in FIG. 1. This rise is used to create the transition at 15, which is the first downward transition of phase C. This transition is then employed to produce the upward transition at 16 for phase B. At 17 a first delay is invoked to produce the downward transition of phase B at 18. This transition then produces the upward transition of phase C at 19. This results in the downward transition of phase A at 20. Then, at 21, the upward transition at 21 of phase D is generated. This invokes the second delay 22 after which the downward transition at 23 of phase D completes the clock cycle. It will be noted that successive transitions are of the opposite polarity and are slightly delayed. The small delay that exists between adjacent clock transitions is achieved by the inherent delay present in a CMOS inverter gate. Typically, this delay is on the order of a few nanoseconds. In the circuits that follow, this delay is modulated along with the first and second delays at 17 and 22 to determine the clock frequency.

The circuits in FIGS. 3 through 6 operate in combination to produce the abovedescribed sequence. It is to be understood that while the circuits to be described are composed of conventional CMOS elements, the various functions could be implemented in other equivalent designs.

Figure 3:
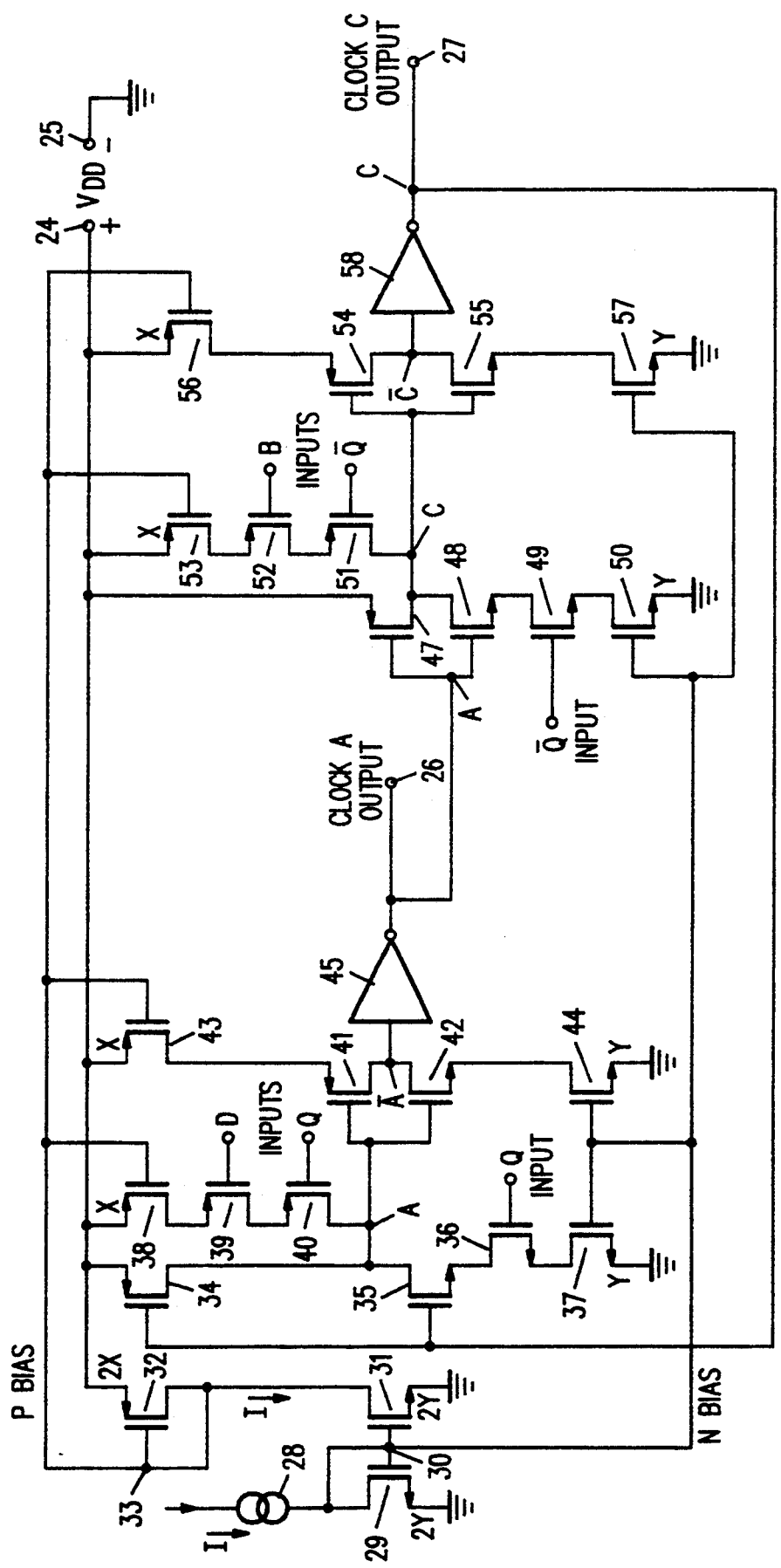
FIG. 3 is a schematic diagram of the circuits that produce clock phases A and C of FIGS. 1 and 2 and the current control input.

FIG. 3 is a schematic diagram of the CMOS circuits that produce clock phases A and C of FIG. 1. The circuits are operated from a $V_{DD}$ power supply connected + to terminal 24 and − to ground terminal 25. Clock A will appear at output terminal 26 and clock C will appear at output terminal 27. The designations adjacent to the transistor emitters denote relative size.

The circuit input is a current I shown as a source 28. It is to be understood that this input current determines the clock frequency. When I=O the clocks stop and a zero frequency is present. As I starts to flow, the clocks will start and operate at a frequency that is proportional to the current.

The input current I flows in N channel transistor 29 which has its gate returned to its drain. This produces an N bias source at node 30 which is at slightly over one threshold above ground. Node 30 is directly connected to the gate of N channel transistor 31 which forms a current mirror. If transistors 29 and 31 are matched, as shown, a current I will flow in transistor 31 and, hence, in P channel transistor 32. Since the gate of transistor 32 is connected to its drain, node 33 will develop a P bias that is slightly lower than one threshold below $+V_{DD}$. As the input current I is varied, the voltages at nodes 30 and 33 will vary slightly so that the bias nodes reflect the change.

N channel transistor 35 is driven from the clock C waveform to accommodate the block 19-20 transition of FIG. 2. N channel transistors 36 and 37 are coupled in series between the source of transistor 35 and ground. Thus, transistor 35 can only conduct when transistor 36 is switched on and its conduction will be I/2 due to transistor 37.

P channel transistors 38, 39 and 40 are coupled in series between the drain of transistor 35 and $+V_{DD}$. Transistors 39 and 40 will conduct when waveform D and the logic Q are both high and the conduction, due to transistor 38, will be I/2.

P channel transistor 41 and N channel transistor 42 form an inverter gate so that $\overline{A}$ will be present at its output. P channel transistor 43 and N channel transistor 44 have their gates respectively returned to nodes 33 and 30 so that I/2 will flow in transistors 41 and 42 when they are switched on.

The drains of transistors 41 and 42 directly drive inverter 45 to produce clock A at output terminal 26.

N channel transistor 48 is driven with clock A out of inverter 45. The source of transistor 48 is coupled to ground through the series combination of N channel transistors 49 and 50. Thus, transistor 48 can only conduct when transistor 49 is rendered conductive by the $\overline{Q}$ signal and its conduction, when switched on, will be I/2 due to transistor 50, which has its gate connected to node 30.

The drain of transistor 48 is coupled to $+V_{DD}$ by the series combination of P channel transistors 51, 52 and 53. These transistors will conduct I/2 due to transistor 53 when both transistors 51 and 52 are respectively switched on by $\overline{Q}$ and clock B. Thus, the clock C signal is present at the drains of transistors 48 and 51. This signal is applied to the gates of P channel transistor 54 and N channel transistor 55, which comprise an inverter gate. Transistor 56, which has its gate returned to node 33, will control the conduction in transistor 54 at I/2 when on. Transistor 57, which has its gate returned to node 30, will control the conduction in transistor 55, when it is on, to I/2.

The drains of transistors 54 and 55 drive inverter 58 to produce clock C at terminal 27. It can be seen that each of the stages in the clock A and clock C generating circuits are controlled by the current source 28 at the input. This means that the delays encountered between clock phase edges are controlled by the action of transistors 37, 38, 43, 44, 50, 53, 56 and 57.

Figure 4:
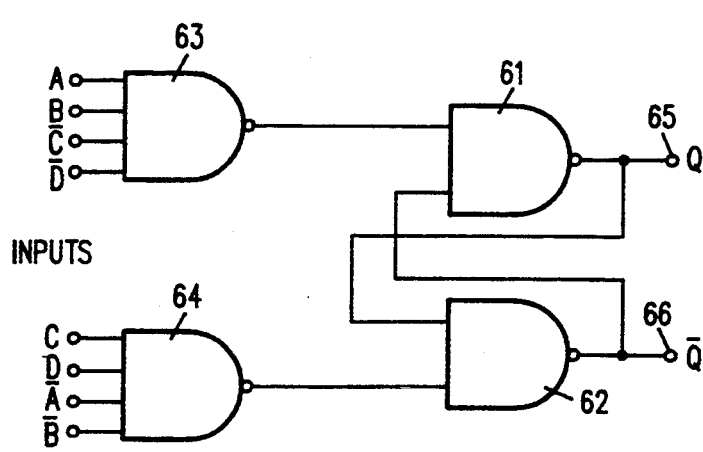
FIG. 4 is a block diagram of a logic circuit that is associated with the circuits of FIGS. 3, 5 and 6.
Figure 5:
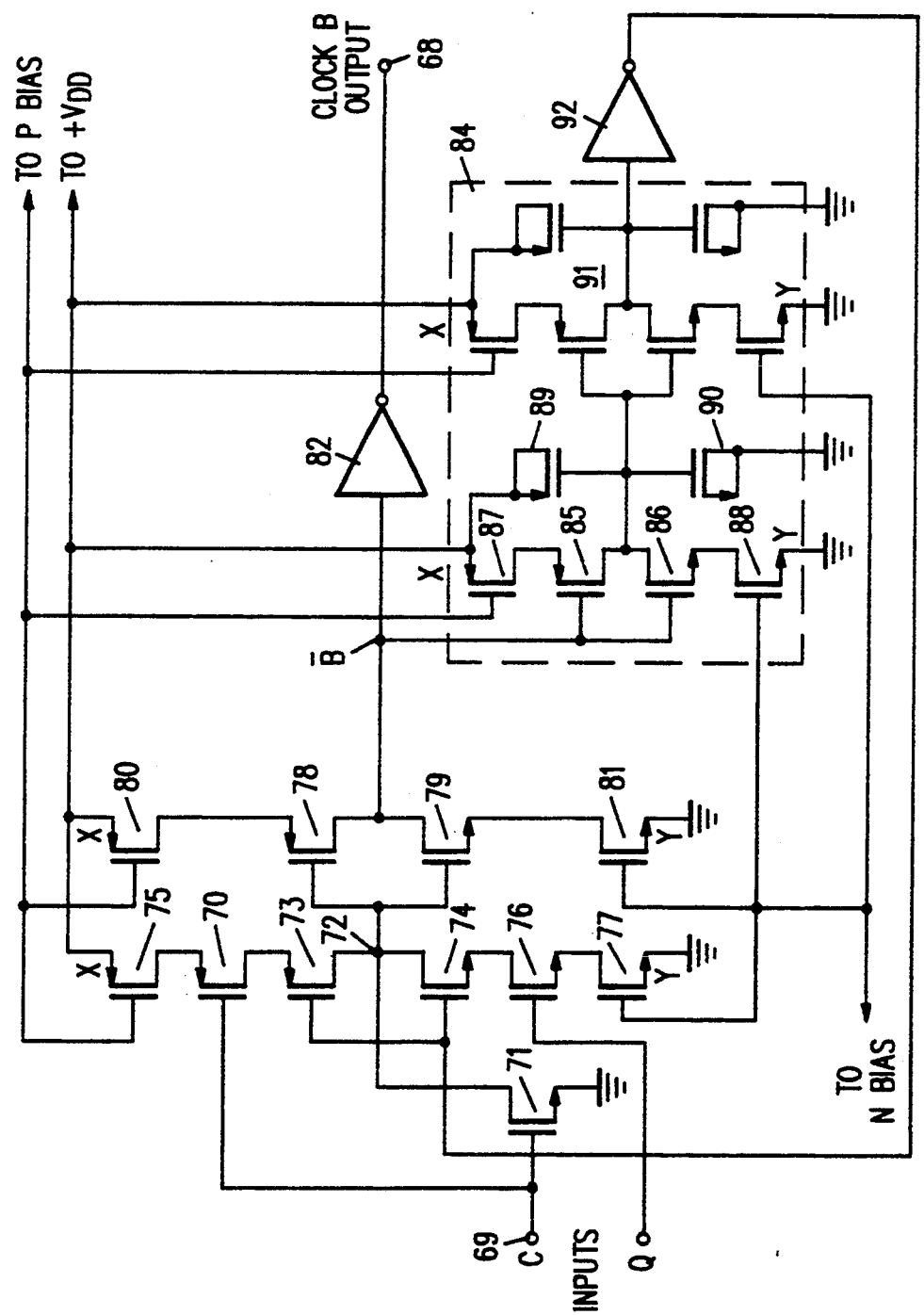
FIG. 5 is a schematic diagram of the circuit that develops the clock phase B.
Figure 6:
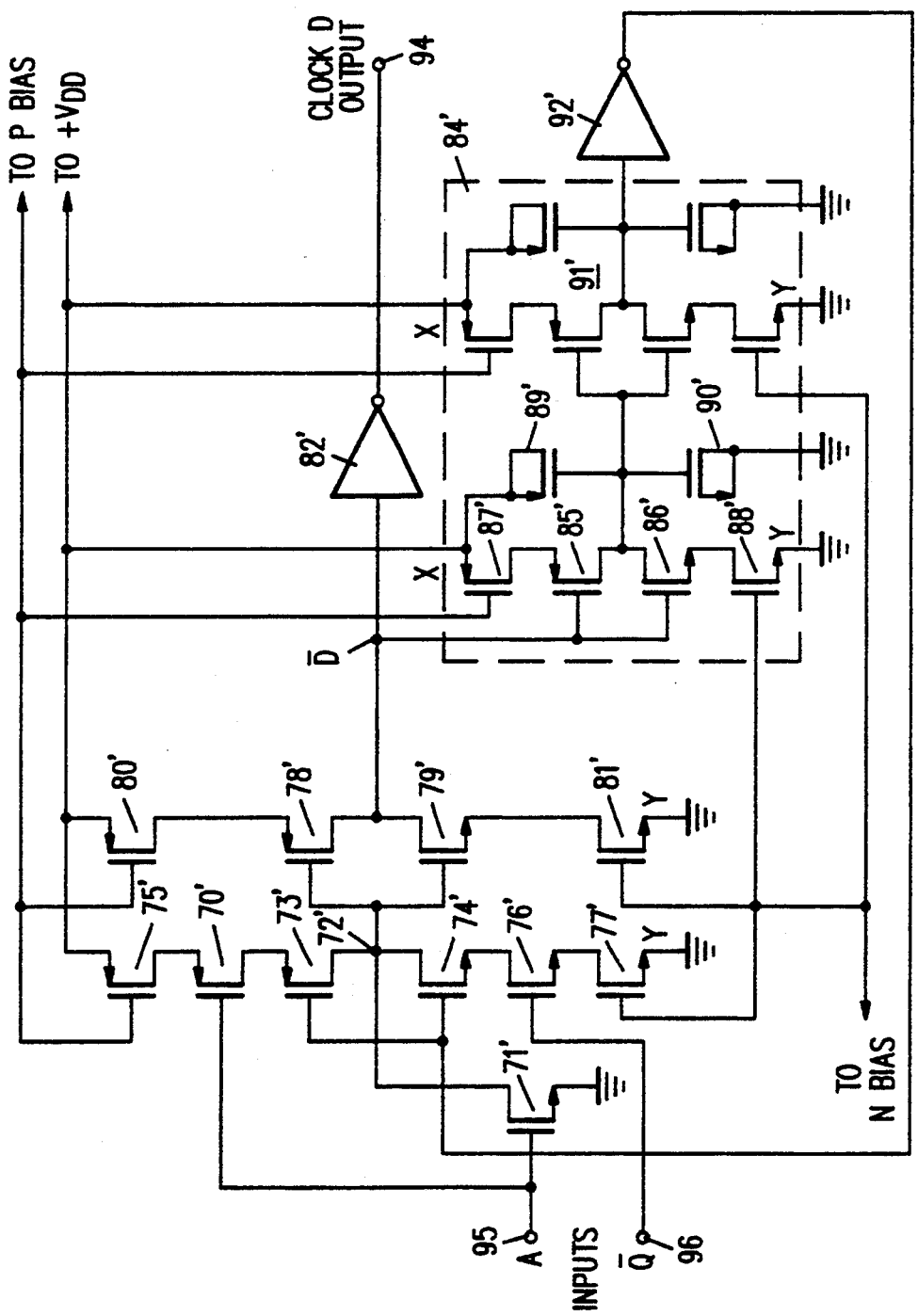
FIG. 6 is a schematic diagram of the circuit that develops the clock phase D.

FIG. 4 is a block diagram of a simple logic circuit that operates to produce the Q and $\overline{Q}$ signals that are employed in the circuits of FIGS. 3, 5 and 6. This circuit functions to identify the clock-cycle halves between the delay 1 and delay 2 intervals of FIG. 1. Two input NAND gates 61 and 62 form a latch. Four input NAND gate 63 provides the latch set pulse and four input NAND gate 64 provides the reset pulse. Q becomes set when A and B both are high, reset when C and D both are high. The additional control inputs to the circuit are added to prevent any unwanted logic state that could lock up the free-running clock oscillator. The Q output appears on terminal 65 and the $\overline{Q}$ output appears on terminal 66. Terminal 65 drives transistors 36 and 40 (of FIG. 3), while terminal 66 drives transistors 49 and 51.

FIG. 5 is a schematic diagram of the clock phase B circuit, which has an output at terminal 68. The input at terminal 69 is driven from inverter 58 of FIG. 3. The $+V_{DD}$, P bias and N bias inputs are also taken from those elements of FIG. 3. The clock C signal at terminal 69 is applied to P channel transistor 70. Transistor 70 is in series with N-channel transistors 73 and 75. These transistors can act to pull node 72 high, limited by a current of I/2 in transistor 75. Node 72 can be pulled low by the series combination of N channel transistors 74, 76 and 77, limited in current to I/2 by transistor 77. Transistor 74 is controlled by input node 69, transistor 76 by signal Q from the FIG. 4 logic circuit.

Node 72 constitutes the input of an inverter gate which is composed of P channel transistor 78 and N channel transistor 79 along with current-limiting transistors 80 and 81. P channel transistor 80 returns the source of transistor 78 to $+V_{DD}$ and controls conduction at I/2. N channel transistor 81 returns the source of transistor 79 to ground and controls conduction at I/2. The drains of transistors 78 and 79 comprise a clock phase $\overline{B}$ circuit node which drives inverter 82 to produce clock phase B at terminal 68.

The circuit includes a delay buffer 84 which is designed to produce delay 1 of FIG. 1. Delay buffer 84 operates as follows. P channel transistor 85 and N channel transistor 86, along with current-limiting transistors 87 and 88, form an inverter gate that is driven from the drains of transistors 78 and 79. P channel transistor 87 couples the source of transistor 85 to $+V_{DD}$ and sets conduction at I/2. N channel transistor 88 couples the source of transistor 86 to ground and sets conduction at I/2. P channel transistor 89 and N channel transistor 90 are connected as shunt capacitor elements which thereby appear in parallel at the drains of transistors 85 and 86. For the voltage to swing at the inverter gate output, the capacitors must be charged (or discharged). Since the charging (or discharging) time is a function of the current applied, the time will be a variable and is a function of I/2. At the maximum current, the time delay will be minimum and is an inverse function of the current I in source 28 of FIG. 3. The delay stage just described is followed by an identical delay stage 91 so that element 84 is a non-inverting delay buffer. The output of buffer 84 is applied to fast-responding inverter 92, the output of which is connected the gates of transistors 73 and 74.

In the clock operation, the downward transition of clock C at terminal 69 (see element 15 of FIG. 2) will produce an upward transition at node 72 (element 16 of FIG. 2). This transition is inverted again and applied to delay buffer 84 to produce Delay #1 (element 17 of FIG. 2). Thus, a delayed downward transition is applied to inverter 92, which in turn produces the delayed downward transition of clock phase B (element 18 of FIG. 2).

FIG. 6 is a schematic diagram of the clock D waveform generator. Its operation is identical to that of the clock B FIG. 5 circuit except for the signal source and output notations. Clock D appears at terminal 94, clock A is applied to input terminal 95 and $\overline{Q}$ is applied to terminal 96. As can be seen in FIGS. 1 and 2, the downward transition of clock A initiates the upward transition of clock D. This transition produces Delay #2, which in turn causes D to fall, thus causing the upward transition of clock A.

Transistors 34 and 47 are not used in normal switching sequence. They function to ensure proper startup of the oscillator by prohibiting the state where clocks A and C simultaneously are low. Similarly, 71 and 71' ensure that clocks B and D cannot be simultaneously high.

The overall result is a four phase clock signal generator which produces sequential clock signals which are useful in driving voltage multiplying charge pump circuitry. The clock frequency is directly proportional to a control current, In a practical example, a four phase clock was operated at a frequency of 40 MHz for a 100 uA input and the frequency fell to zero at zero current.

The invention has been described and a preferred embodiment detailed. When a person skilled in the art reads the foregoing description, alternatives and equivalents, within the spirit and intent of the invention, will be apparent. Accordingly, it is intended that the scope of the invention be limited only by the claims that follow.

I claim

1. A four phase clock generator comprising:
   first means for generating an upward transition in a first phase;
   second means responsive to said upward transition in said first phase for generating a downward transition in a third phase;
   third means responsive to said downward transition in said third phase for generating an upward transition in a second phase;
   first delay means responsive to said upward transition of said second phase, to produce the high portion of a second phase, said first delay means being operative to produce a delayed downward transition of said second phase;
   fourth means responsive to said downward transition of said second phase for generating an upward transition of said third phase;
   fifth means responsive to said upward transition of said third phase for generating a downward transition of said first phase;
   sixth means responsive to said downward transition of said first phase for producing an upward transition of a fourth phase;
   second delay means responsive to said upward transition of said fourth phase, said second delay means being operative to produce a delayed downward transition of said fourth phase; and
   said first means responsive to said downward transition of said fourth phase to produce said upward transition of said first phase whereby said clock generator starts a new clock cycle.

2. The four phase clock generator of claim 1 wherein each of said first through sixth means comprise inverter gates whereby said transitions in said four phases are delayed.

3. The four phase clock generator of claim 1 wherein said first and second delay means are made variable thereby to make the clock frequency variable.

4. The four phase clock generator of claim 3 whereby said first and second delay means are made variable in response to a current input.

5. The four phase clock generator of claim 2 wherein said first through sixth inverter gates include means for varying their delay performance.

6. The four phase clock generator of claim 5 wherein said first through said sixth inverter gates are made variable in response to a current input.

7. The four phase clock generator of claim 6 wherein said current input also operates said first and second delay means.

* * * * *

UNITED STATES PATENT AND TRADEMARK OFFICE
CERTIFICATE OF CORRECTION

PATENT NO. : 5,398,001
DATED : Mar. 14, 1995
INVENTOR(S) : A. Karl Rapp

It is certified that error appears in the above-identified that said Letters Patent is hereby corrected as shown below:

On title page, item [19] "Rapp A. Karl" should read --A. Karl Rapp-- item [75] "Rapp A. Karl" should read --A. Karl Rapp--

Signed and Sealed this

Sixteenth Day of May, 1995

Attest:

BRUCE LEHMAN

Attesting Officer

Commissioner of Patents and Trademarks